United States Patent
Jiang et al.

(10) Patent No.: US 6,518,094 B2
(45) Date of Patent: Feb. 11, 2003

(54) CENTER BOND FLIP-CHIP SEMICONDUCTOR DEVICE AND METHOD OF MAKING IT

(75) Inventors: Tongbi Jiang, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/866,641

(22) Filed: May 30, 2001

(65) Prior Publication Data

US 2001/0041383 A1 Nov. 15, 2001

Related U.S. Application Data

(62) Division of application No. 09/571,721, filed on May 15, 2000, now Pat. No. 6,380,632.

(51) Int. Cl.[7] .......................... H01L 21/44; H01L 21/48; H01L 21/50
(52) U.S. Cl. .................. 438/108; 438/121; 438/124; 438/125; 438/126; 438/613
(58) Field of Search ................. 438/108, 121, 438/124, 125, 126, 127, 613; 257/686, 777, 779, 738, 685, 774, 737

(56) References Cited

U.S. PATENT DOCUMENTS 5,608,265 A * 3/1997 Kitano et al. ............... 257/738
6,180,881 B1 * 1/2001 Isaak .......................... 257/686

* cited by examiner

Primary Examiner—Matthew Smith
Assistant Examiner—Igwe U. Anya
(74) Attorney, Agent, or Firm—Dickstein Shapiro Morin & Oshinsky LLP

(57) ABSTRACT

A center bond flip-chip device carrier and a method for making and using it are described. The carrier includes a flexible substrate supporting a layer of conductive material and a layer of elastomeric material. At least one pocket is formed in the layer of elastomeric material and sized and shaped to house a solder ball. The solder ball is electrically connected to a die positioned on the layer of elastomeric material and also electrically connected to the layer of conductive material.

9 Claims, 5 Drawing Sheets

FIG. 7
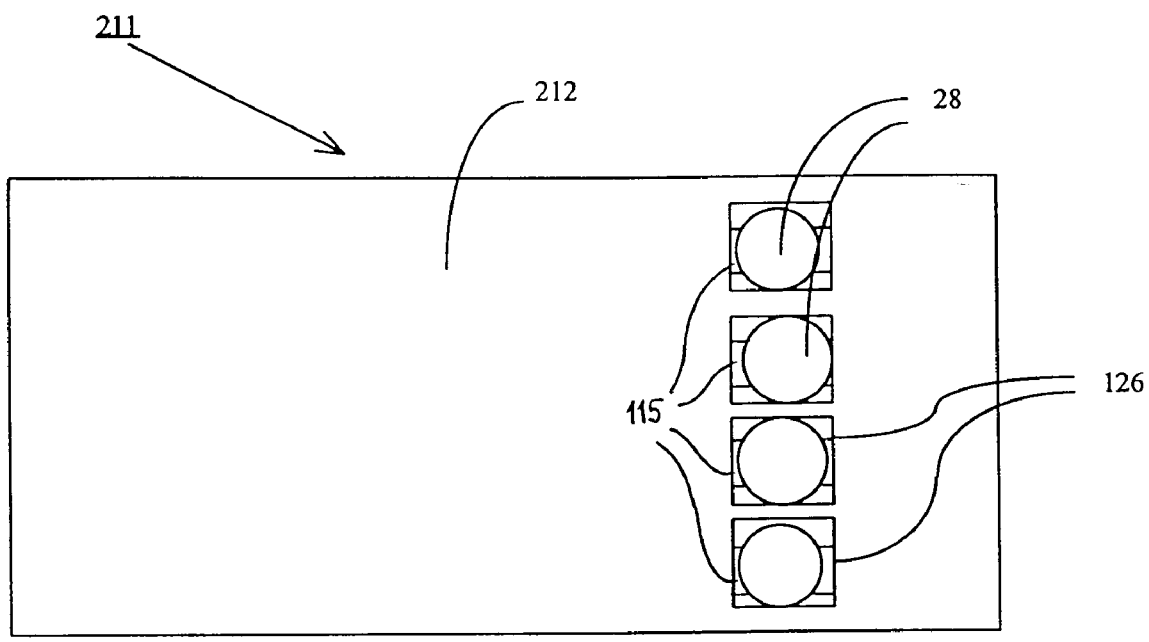
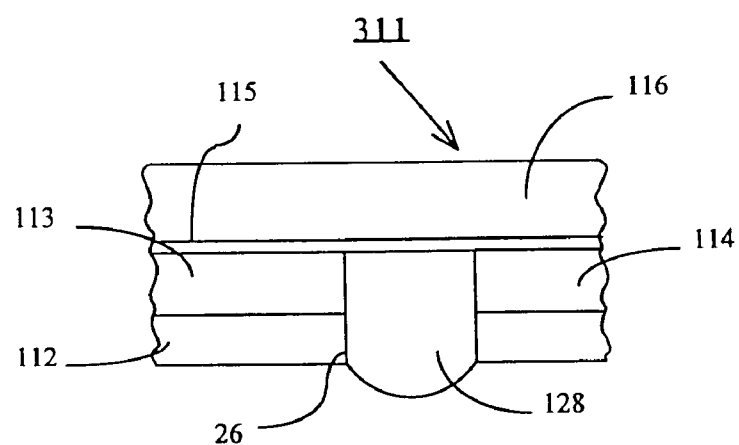
FIG. 8

CENTER BOND FLIP-CHIP SEMICONDUCTOR DEVICE AND METHOD OF MAKING IT

This application is a divisional of U.S. application, Ser. No. 09/571,721, filed May 15, 2000, now U.S. Pat. No. 6,380,632 the entirety of which is incorporated herein by reference.

FIELD OF THE INVENTION

The present invention generally relates to semiconductor chip packaging. More particularly, the present invention relates to a center bond flip-chip semiconductor device and a method for making it.

BACKGROUND OF THE INVENTION

Semiconductor device packaging techniques are well known. In some conventional packaged devices a die is attached to a carrier, and contacts of each are electrically connected. In one such packaged device, called a flip-chip device, a semiconductor chip is flipped and bonded with a carrier such that contacts of the chip face and bond to contacts of the carrier.

With reference to FIGS. 1–3, a conventional center bond flip-chip device 10 is shown including a die 30 and a carrier 11 fabricated from a flexible substrate 12, a conductor layer 14 which includes a polyimide core 13 and a plurality of conductive traces 15, and an elastomeric layer 16. The flexible substrate 12 is formed of a material exhibiting high temperature stability as well as high mechanical rigidity. The substrate 12 may be a flexible tape, such as, for example, a polyimide tape. Two commercially available polyimide tapes, KAPTON® from E. I. DuPont Nemours and Company and UPILEX® from Ube Industries, Ltd., can be used to form the substrate 12.

The elastomeric layer 16 includes a first portion 17 and a second portion 19 of generally equal size and separated by a gap 22. The elastomeric layer 16 may be formed of a silicone or a silicone-modified epoxy.

The conductive traces 15 may be located within or on the polyimide core 13 in a variety of ways. One way, which is an addition method, is to build up the conductive traces 15 on the polyimide core 13 through electrolytic deposition. The electrolytic deposition may be accomplished with a mask, or if performed without a mask, a subsequent etching step may be employed to create the conductive traces 15. Other suitable methods include sputter coating and laminating a sheet of conductive material, such as copper, and etching away excess copper to form the traces 15.

The conductive traces 15 are each electrically connected to a solder ball 28 within an inset 26. Although a single solder ball 28 is shown in FIGS. 1–2, it is to be understood that the number of solder balls 28 should correspond with the number of conductive traces 15 within the conductor layer 14. The solder balls 28 are used to mount the flip-chip device 10 to a circuit board or other electrical structure (not shown).

A solder mask 18 is positioned on the conductor layer 14 within the gap 22. As illustrated, the gap 22 is rectangularly shaped, although any configured gap will suffice as long as the solder mask 18 is not covered by the elastomeric material 16.

The die 30 is shown in dotted line above the carrier 11. In use, the die 30 is positioned on the elastomeric material 16 of the flip-chip carrier 11. The flip-chip carrier 11 is electrically connected with the die 30 by way of suitable conductive connecting structures, such as, for example, solder balls 24 positioned within a gap 20 of the solder mask 18. The solder balls 24 are in electrical connection with respective conductive traces 15 through a gap 20 in the solder mask 18 and with suitable contacts on the die 30.

Conventional center bond flip-chip semiconductor devices of the type shown in FIGS. 1–3 have several disadvantages. One is that the solder mask 18 on the carrier 11 has the large, unsupported central gap 20 in which a plurality of solder balls 24 are positioned. The lack of support in the large singular gap 20 allows movement of the solder balls 24 causing them to sometimes contact with one another. Further, the solder mask 18 is positioned at a distance (currently around 150 micrometers) from the elastomeric material 16 due to poor adhesion between the solder mask 18 and the elastomeric material 16. As a consequence, a minimum possible size of the flip-chip device 10 is at least partly determined by the distance between the solder mask 18 and the elastomeric material 16.

There is, therefore, a need for a center bond flip-chip semiconductor device design which alleviates to some extent these disadvantages.

SUMMARY OF THE INVENTION

The present invention provides a center bond flip-chip semiconductor carrier including a flexible substrate, a core material with a plurality of conductive traces positioned on the flexible substrate, and a die attach material formed on the layer of conductive material. The die attach material includes a plurality of pockets, each for confining an interconnect conductor, such as a solder ball, over a conductive trace.

The present invention further provides an electronic system including a processor-based system, a semiconductor die in electrical connection with the processor-based system, and a die carrier connected to the semiconductor die. The die carrier has a flexible substrate, a core material with a plurality of conductive traces positioned on the flexible substrate, and a die attach material formed on the layer of conductive material. The die attach material includes a plurality of pockets, each for confining an interconnect conductor, such as a solder ball, over a conductive trace.

The present invention further provides a method for making a carrier for a semiconductor device. The method includes the steps of forming a layer of elastomeric material over a layer of conductive material in the form of traces and forming at least one pocket in the layer of elastomeric material extending to a trace of the conductive material.

The present invention further provides a method for making a carrier for a semiconductor device. The method includes locating at least one conductive trace on a core material, forming a die attach material over the core material, and forming a plurality of pockets in the die attach material extending to the at least one conductive trace.

The foregoing and other advantages and features of the invention will be more readily understood from the following detailed description of the invention, which is provided in connection with the accompanying drawings.

BRIEF DESCRIPTION OF THE DRAWINGS

FIG. 7 is a bottom view of a center bond flip-chip device carrier constructed in accordance with an embodiment of the invention.

FIG. 8 is a partial side view of a center bond flip-chip device carrier constructed in accordance with an embodiment of the invention.

DETAILED DESCRIPTION OF THE PREFERRED EMBODIMENTS

Figure 3:
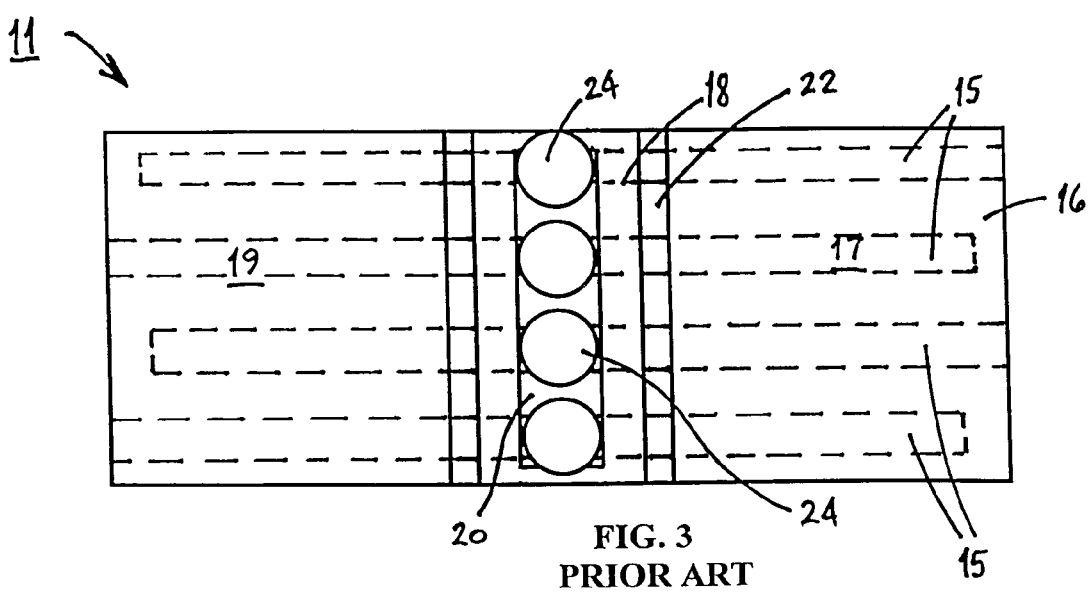
FIG. 3 is a top view of the carrier of the conventional center bond flip-chip device of FIG. 1.
Figure 4:
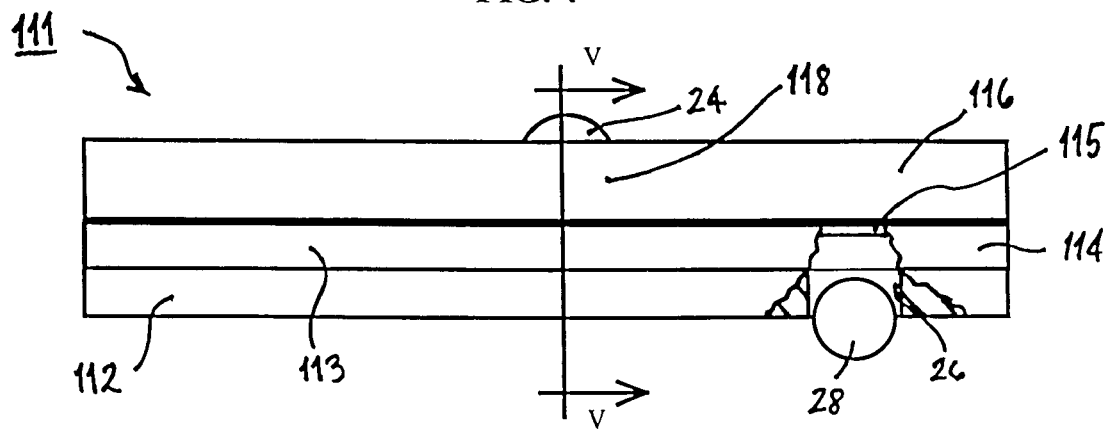
FIG. 4 is a side view of a center bond flip-chip device carrier constructed in accordance with an embodiment of the invention.
Figure 5:
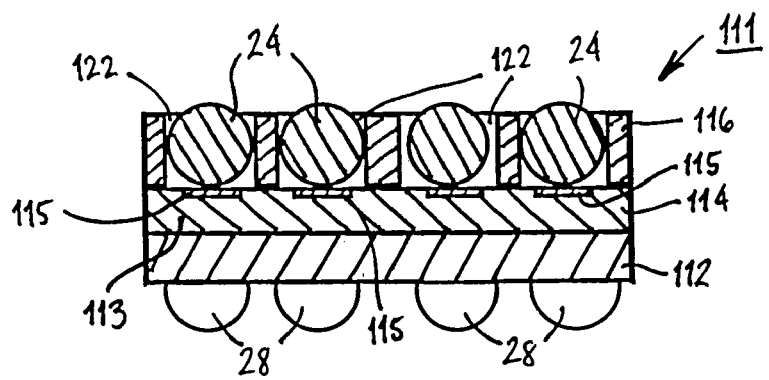
FIG. 5 is a cross-sectional view taken along line V—V of the carrier of FIG. 4.
Figure 6:
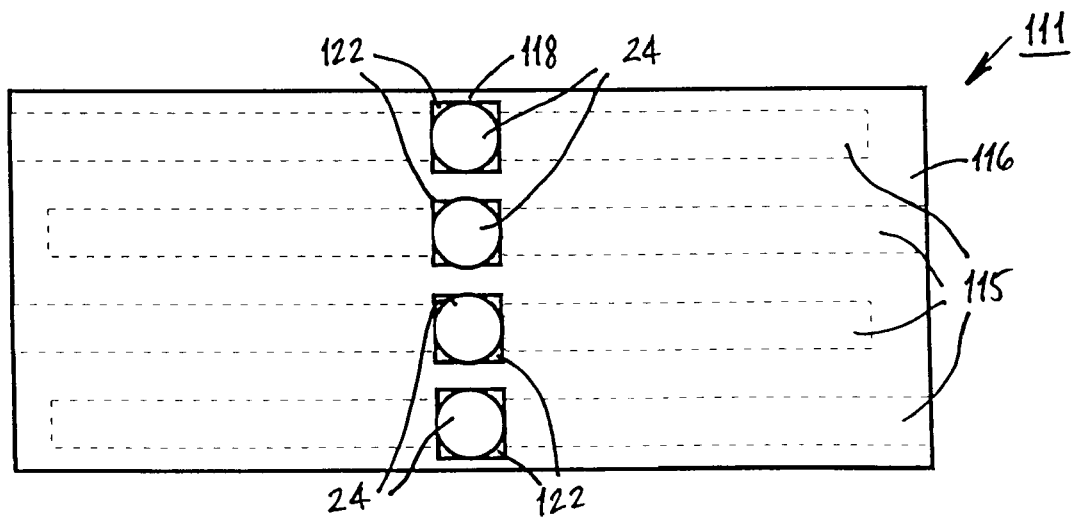
FIG. 6 is a top view of the carrier of FIG. 4.

Referring to FIGS. 4–6, there is shown a center bond flip-chip semiconductor carrier 111, which includes a flexible substrate 112, a conductor layer 114 and a die attach material 116. The die attach material 116 may be an elastomer, and/or an adhesive, such as an adhesive film. The die 30 is not shown in FIGS. 4–6 for clarity of illustration. The conductor layer 114, like the conductor layer 14 of FIGS. 1–3, includes a polyimide core 113 and a plurality of conductive traces 115.

Figure 1:
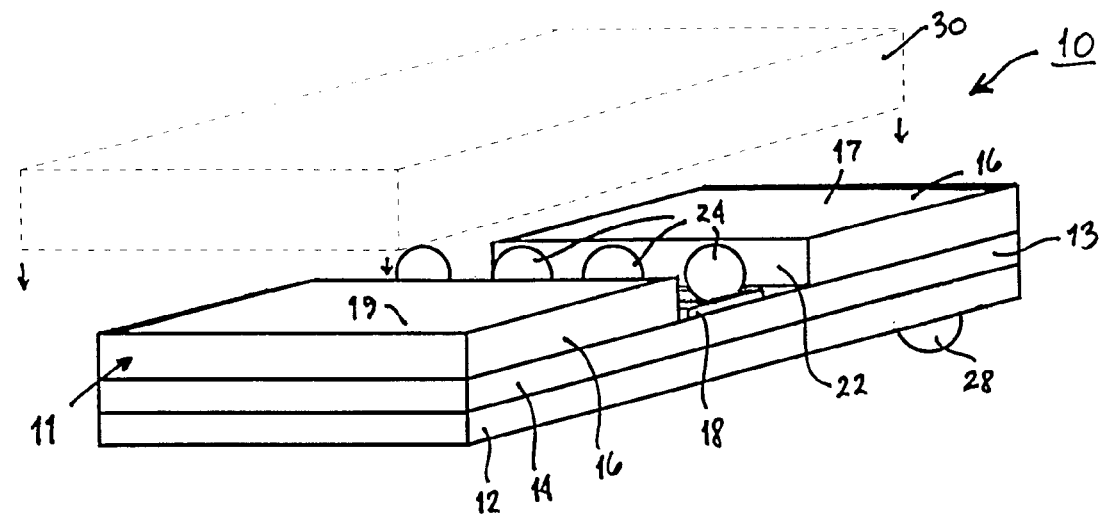
FIG. 1 is a perspective view of a conventional center bond flip-chip device.
Figure 2:
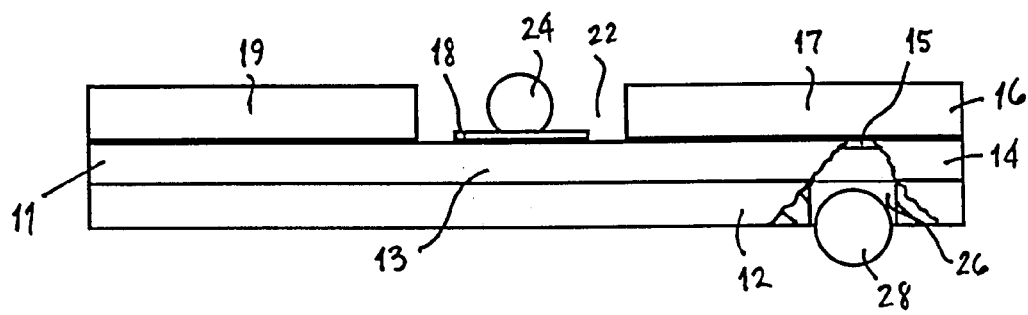
FIG. 2 is a side view of a carrier of the center bond flip-chip device of FIG. 1.

Unlike the carrier 11 in FIGS. 1–3, the carrier 111 does not include a gap 22 separating two portions of the elastomeric material 17, 19. Instead, the die attach material 116 completely overlays the conductor layer 114. A plurality of pockets 122 are created in a portion 118 of the die attach material 116. The pockets 122 are used to hold respective solder balls 24 in place. The pockets 122 may be formed through a variety of suitable methods. Preferably, the pockets 122 are laser drilled. The dimensions of each of the pockets 122 is determined based upon the solder ball 24 volume or dimensions. Specifically, each pocket 122 is drilled to a size and configuration to receive a solder ball 24 of a particular volume or specific dimensions. Advantageously, the pockets 122 serve to guide and control solder flow to prevent wicking and movement of the solder during their deposition or subsequent use in bonding to a die.

The conductive traces 115 within the core 113 are also electrically connected to the solder balls 28 within the inset 26. Like the inset 26 of FIGS. 1–3, the inset 26 of FIGS. 4–6 is a single depressed region sized and configured to house a plurality of solder balls 28 for contact with a respective conductive trace 115. As with the conventional flip-chip device carrier 11 of FIGS. 1–2, while one solder ball 28 is shown in FIG. 4, the number of solder balls 28 will typically correspond to the number of conductive traces 115 within the core 113.

FIG. 7 shows another embodiment of the present invention, illustrating the underside of a carrier 211. Specifically, the underside of a flexible substrate 212 is shown having a plurality of pockets 126. Solder balls 28, each in electrical contact with a respective conductive trace 115, are sized to be received within the pockets 126. Thus, the solder balls 28 which are designed to bond with a substrate, for example, a printed circuit board, are also confined by the pockets 126.

FIG. 8 shows another embodiment of the present invention. Specifically, illustrated from the side is a portion of a carrier 311 showing an inset 26 extending through the flexible substrate 112 and the core 113 to the conductive trace 115. A conductive material 128, such as solder, fills in the inset 26, extends outwardly, and acts to electrically connect the conductive trace 115 to a circuit board or other electrical structure.

Figure 9:
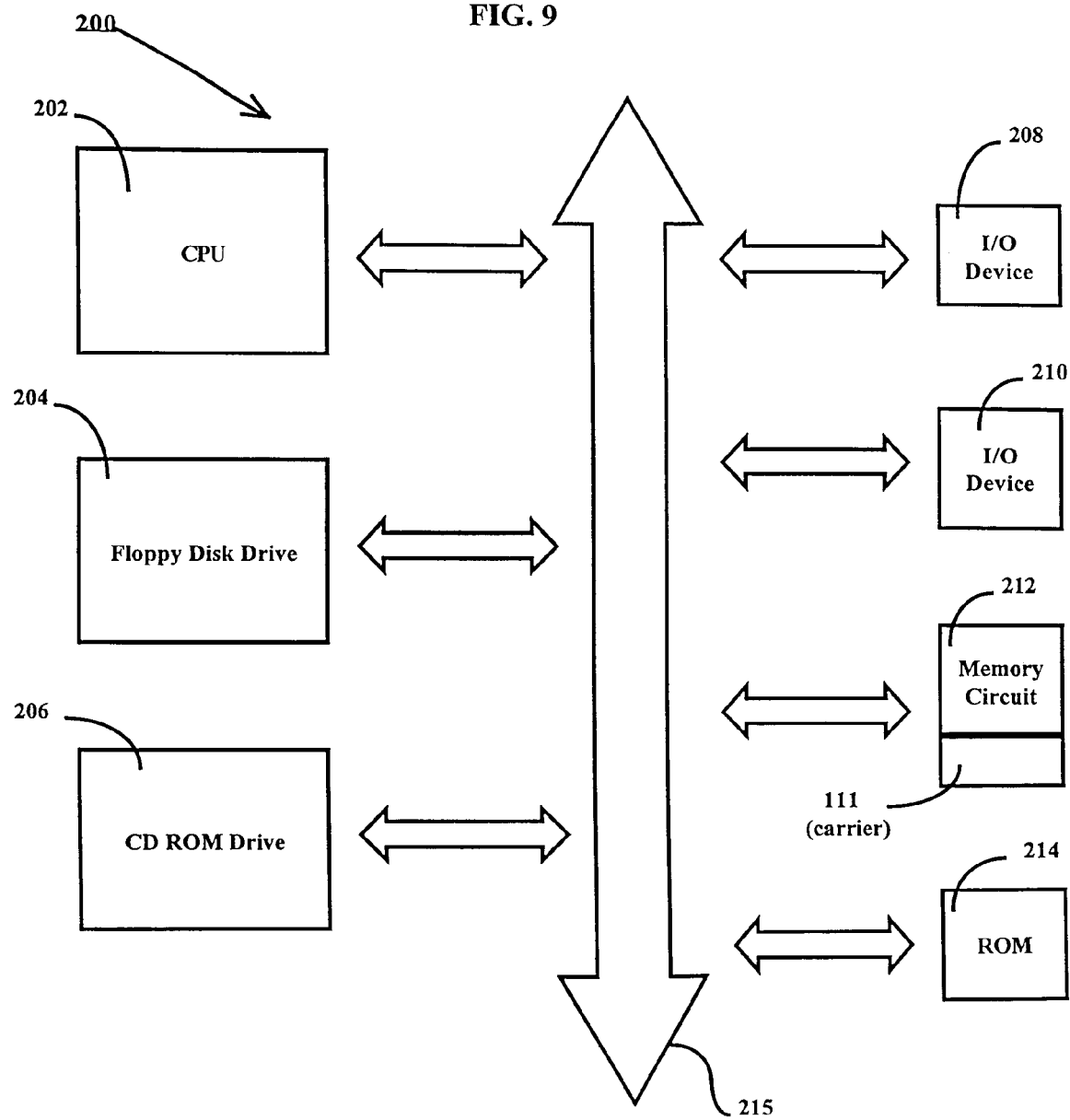
FIG. 9 illustrates a processor-based system utilizing a center bond flip-chip device constructed in accordance with the present invention.

Referring now to FIG. 9, next will be described the use of the carrier 111 carrying a die 30 which contains a random access memory circuit 212 within a processor-based system 200. The memory circuit 212 may be random access memory (RAM), dynamic random access memory (DRAM), static random access memory (SRAM), synchronous dynamic random access memory (SDRAM), pseudo-static dynamic random access memory (PSDRAM), video random access memory (VRAM), video dynamic random access memory (VDRAM), bubble memory, flash memory, or any other suitable random access memory circuit. The processor-based system 200 may be a computer system, a process control system or any other system employing a processor and associated memory. The system 200 includes a central processing unit (CPU) 202, which may be a microprocessor. The CPU 202 communicates with a circuit board containing the memory circuit 212, which includes the carrier 111, over a bus 215. The CPU 202 further communicates with one or more I/O devices 208, 210 over the bus 215. Although illustrated as a single bus, the bus 215 may be a series of buses and bridges commonly used in a processor-based system. Further components of the system 200 include a read only memory circuit 214 and peripheral devices such as a floppy disk drive 204 and CD-ROM drive 206. The read only memory circuit 214 may include read only memory (ROM), programmable read only memory (PROM), erasable programmable read only memory EPROM), electrically alterable programmable read only memory (EAPROM), electrically erasable programmable read only memory (EEPROM), un-erasable programmable read only memory (UPROM), or any other suitable read only memory circuit. The floppy disk drive 204 and CD-ROM drive 206 also communicate with the CPU 202 over the bus 215.

Figure 10:
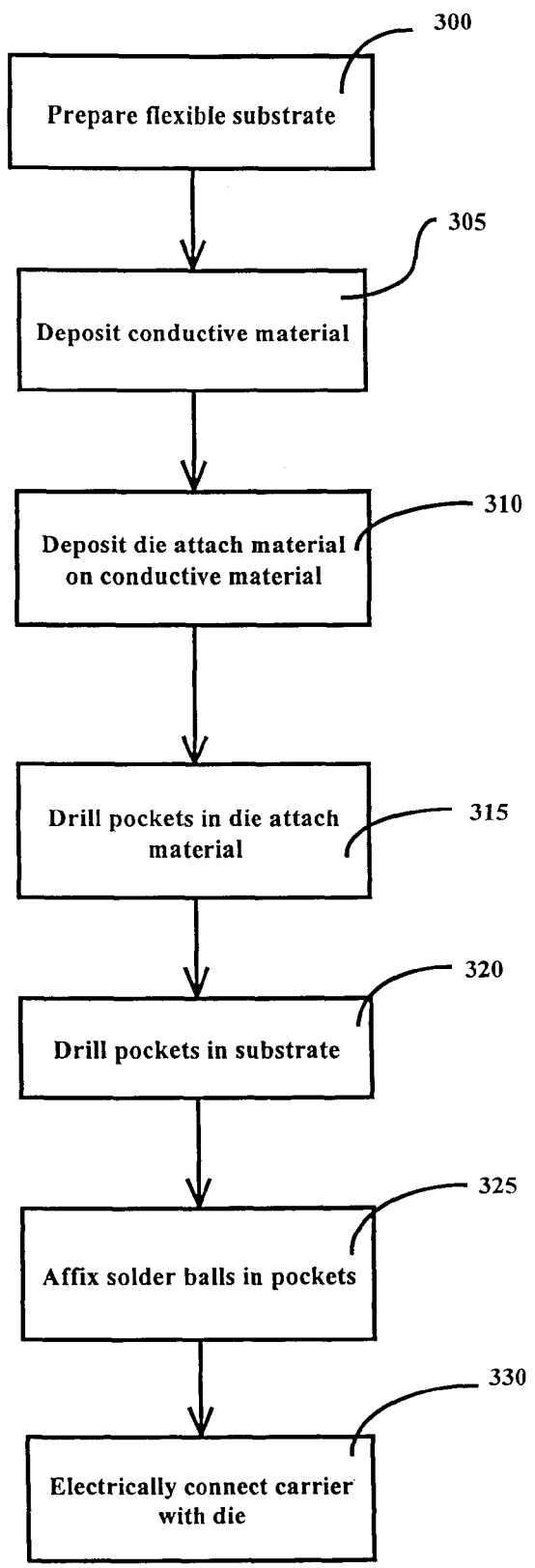
FIG. 10 is a flow diagram of the steps for making the center bond flip-chip device of FIGS. 4–8.

With reference to FIG. 10, next will be described a method for making the flip-chip carrier 111 as well as a semiconductor device in which the carrier 111 is used to mount and support a semiconductor die. Manufacture of the carrier 111 begins by forming the flexible substrate 112 at step 300. The conductive traces 115 are placed on a polyimide core 113 at step 305 by way of electrolytic deposition; sputter coating; laminating a conductive material, such as copper, to the core 113 and etching away the excess; or, other suitable conductor trace forming method. At step 310, the die attach material 116, which may also be an elastomeric material, is deposited over the substrate 112 and the conductor layer 114. The pockets 122 are then laser drilled at step 315, and the pockets 126 (or inset 26) are drilled at step 320, thus forming the carrier 111.

Solder balls 24 on bumped die are then deposited within each pocket 122 at step 325 to create an electrical connection between the conductive material 114 and the solder balls 24. Then, the solder bumped die 30 is mechanically coupled to the die attach material 116 and electrically connected to the solder balls 24.

Users of the thus manufactured semiconductor devices 110 may attach and electrically connect the devices with a printed circuit board or other common base for mounting of components to form an electronic system.

The present invention provides a flip-chip carrier and a semiconductor device employing it which utilizes pockets to encompass solder balls, which reduces the chance of solder movement and wicking.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the description and illustrations depict a center bond flip-chip semiconductor device, it is to be understood that the invention is not so limited. Further, while four pockets 122 and solder balls 24 have been shown and described for the carrier 111 in order to illustrate the invention, it should be apparent that many more pockets 122 and solder balls 24 will be used in practice. Indeed, any number of pockets 122 and solder balls 24 may be included. The same can be said regarding the pockets 126 in the substrate 212. Further, while the pockets 122, and the pockets 126 are depicted as having a rectangular profile, the pockets 122 and pockets 126 may take any configuration which permits enclosure of, respectively, the solder balls 24, 28. Accordingly, the invention is not to be seen as limited by the foregoing description, but is only limited by the scope of the appended claims.

What is claimed as new and desired to be protected by Letters Patent of the United States is:

1. A method for making a carrier for a semiconductor device, said method comprising:
   locating at least one conductive trace on a core material;
   forming a die attach material, having a pair of opposing surfaces, over said core material and covering said at least one conductive trace; and
   forming a plurality of pockets to extend completely between said opposing surfaces of said die attach material, wherein each said pocket is formed to allow a solder ball to project from said at least one conductive trace and through both said opposing surfaces.

2. The method of claim 1, wherein said locating at least one conductive trace on said core material comprises depositing said at least one conductive trace.

3. The method of claim 1, wherein said locating at least one conductive trace on said core material comprises sputter coating said at least one conductive trace.

4. The method of claim 1, wherein said locating at least one conductive trace on said core material comprises laminating a conductive material to said core material and etching away the excess to produce said at least one conductive trace.

5. The method of claim 1, further comprising depositing a solder ball in each said pocket.

6. A method for making a semiconductor device comprising:
   assembling a carrier, comprising:
      locating at least one conductive trace on a core material;
      forming a die attach material over said core material;
      forming a first plurality of pockets in said die attach material extending to said at least one conductive trace;
      forming a substrate beneath said core material;
      forming a second plurality of pockets in said substrate extending to said at least one conductive trace, said first plurality of pockets being displaced from said second plurality of pockets in a lateral direction; and
   electrically connecting said carrier to a semiconductor die.

7. The method of claim 6, wherein said locating at least one conductive trace on said core material comprises depositing said at least one conductive trace.

8. The method of claim 6, wherein said locating at least one conductive trace on said core material comprises sputter coating said at least one conductive trace.

9. The method of claim 6, wherein said locating at least one conductive trace on said core material comprises laminating a conductive material to said core material and etching away the excess to produce said at least one conductive trace.

* * * * *